United States Patent [19]
Ikeda et al.

[11] Patent Number: 5,635,751
[45] Date of Patent: *Jun. 3, 1997

[54] HIGH FREQUENCY TRANSISTOR WITH REDUCED PARASITIC INDUCTANCE

[75] Inventors: Yasukazu Ikeda; Hideo Matsumoto; Susumu Sakamoto, all of Itami, Japan

[73] Assignee: Mitsubishi Denki Kabushiki Kaisha, Tokyo, Japan

[*] Notice: The term of this patent shall not extend beyond the expiration date of Pat. No. 5,465,007.

[21] Appl. No.: 469,826

[22] Filed: Jun. 6, 1995

Related U.S. Application Data

[63] Continuation-in-part of Ser. No. 272,864, Jul. 8, 1994, Pat. No. 5,465,007, which is a continuation of Ser. No. 940,312, Sep. 3, 1992, abandoned.

[30] Foreign Application Priority Data

Sep. 5, 1991 [JP] Japan ..................... 3-225670

[51] Int. Cl.$^6$ ..................... H01L 23/12; H01L 23/50
[52] U.S. Cl. ..................... 257/584; 257/587; 257/666; 257/700
[58] Field of Search ..................... 257/502, 507, 257/508, 532, 557, 565, 578, 585, 587, 593, 666, 690, 692, 698, 700, 703

[56] References Cited

U.S. PATENT DOCUMENTS

| | | | |
|---|---|---|---|
| 3,916,434 | 10/1975 | Garboushian | 257/704 |
| 3,999,142 | 12/1976 | Presser et al. | 257/532 |
| 4,168,507 | 9/1979 | Yester, Jr. | 257/584 |
| 4,783,697 | 11/1988 | Benenati et al. | 257/584 |

FOREIGN PATENT DOCUMENTS

| | | | |
|---|---|---|---|
| 0157240 | 8/1985 | Japan | 257/532 |
| 0109332 | 5/1987 | Japan | 257/565 |
| 0063454 | 3/1993 | Japan | 257/587 |

*Primary Examiner*—Peter Toby Brown
*Attorney, Agent, or Firm*—Leydig, Voit & Mayer

[57] ABSTRACT

A semiconductor device includes a transistor mounted on a chip substrate. A metal sheet is disposed on the metallized electrode to which the base, for example, of the transistor is electrically connected. The base is electrically connected by a wire to the metal sheet. An MOS capacitor is disposed on the metal sheet and a through-hole beneath the metal sheet connects the metallized electrode directly to a metallized ground electrode disposed on the bottom surface of the substrate.

1 Claim, 4 Drawing Sheets

HIGH FREQUENCY TRANSISTOR WITH REDUCED PARASITIC INDUCTANCE

This disclosure is a continuation-in-part of U.S. patent application Ser. No. 08/272,864, filed Jul. 8, 1994, now U.S. Pat. No. 5,465,007, which is a continuation of U.S. patent application Ser. No. 07/940,312, filed Sep. 3, 1992 and now abandoned.

FIELD OF THE INVENTION

This invention relates to a semiconductor device including a high frequency, high output transistor and, more particularly, to such a semiconductor device with reduced parasitic inductance.

BACKGROUND OF THE INVENTION

FIG. 1 is a plan view of an example of a conventional semiconductor device, and FIG. 2 is a cross-sectional view along line 2—2 in FIG. 1. As shown in FIGS. 1 and 2, on a chip substrate 1 of an insulating ceramic having good thermal conductivity, such as beryllia (BeO), metallized electrodes 21, 22, and 23 are disposed in a predetermined pattern. As the metallized electrodes, three-layer electrodes having a structure such as W/Ni/Ag, W/Ni/Au, MoMn/Ni/Ag, or MoMn/Ni/Au may be used.

A base lead 3 and a collector lead 4 are brazed to the top surfaces of the metallized electrodes 21 and 23, respectively. The substrate with the metallized electrodes and the base and collector leads 3 and 4 brazed to the respective metallized electrodes is referred to as a chip carrier. A high-frequency, high-power transistor 5 is mounted on the chip carrier with its collector C contacting the metallized electrode 23. An MOS capacitor 6 is mounted on the metallized electrode 22. A metallic bridge 7 is disposed above and across the metallized electrode 23 and is connected to the metallized electrode 22.

The emitter E of the transistor 5 is electrically connected to the metallized electrode 23 and to the metallic bridge 7 by wires 8, and the base B is electrically connected to the MOS capacitor 6 by wires 9. The MOS capacitor 6 is electrically connected to the metallized electrodes 21 by wires 10. The metallic bridge 7 is provided for reducing the parasitic inductance associated with the emitter electrode wiring of the transistor 5. The metallized electrode 22 is connected to a metallized grounding electrode 12 disposed on the opposite surface of the substrate 1 by a metallization 11 on the sides of the substrate 1. The MOS capacitor 6 is connected in the circuit between the base of the transistor 5 and ground in order to cancel the parasitic inductance that could be introduced into the circuit by the wires 8, 9, and 10. As shown in FIG. 3, the MOS capacitor 6 may be formed by disposing an $n^+$-type semiconductor layer 17 on the metallized electrode 22, an $SiO_2$ layer 18 on the layer 17, and an Au layer 19 on the layer 18. The wires 9 and 10 are bonded to the Au layer 19.

The semiconductor device shown in FIGS. 1 and 2 comprises a chip 16 mounted on arms 14 and 15 of a frame 13, as shown in FIG. 4. The frame 13 is an Ni alloy, such as Kovar (29%Ni—17%Co—Fe) and 42 alloy (42%Ni—Fe). The arms 14 and 15 are cut to a desired length to provide the base lead 3 and the collector lead 4.

Because of the metallic bridge 7, which is provided for reducing the parasitic inductance of the wire 8 connected to the transistor, in particular, its emitter E, a high degree of integration on the chip carrier cannot be achieved. The side metallization 11, which is used for connection to the bottom metallized ground electrode 12, has a parasitic inductance that is not negligible so that an adequate high frequency characteristic cannot be realized. Therefore, an object of the present invention is to provide a small-sized semiconductor device including a transistor having a reduced parasitic inductance. The reduction of the size improves the degree of integration.

SUMMARY OF THE INVENTION

A semiconductor device includes an electrically insulating substrate having opposed top and bottom surfaces; first, second, and third metallized electrodes disposed on the top surface of the substrate; a high frequency transistor having an emitter, a base, and a collector disposed on the first metallized electrode with the collector contacting the first metallized electrode; a metal sheet disposed on the second metallized electrode; a wire connecting the emitter of the transistor to the third metallized electrode; a wire connecting the base of the transistor to the metal sheet, thereby connecting the base to the second metallized electrode via the metal sheet; a through-hole extending through the substrate and having an inside surface; and a metallized ground electrode disposed on the bottom surface of the substrate and continuously extending on the inside surface of the through-hole, electrically connected to the second metallized electrode, the metal sheet covering and closing the through-hole, the through-hole being open at the bottom surface of the substrate.

A semiconductor device includes an electrically insulating substrate having opposed top and bottom surfaces; first, second, and third metallized electrodes disposed on the top surface of the substrate; a high frequency transistor having an emitter, a base, and a collector disposed on the first metallized electrodes with the collector contacting the first metallized electrode; a metal sheet disposed on the second metallized electrode; an MOS capacitor disposed on the metal sheet; wires connecting the emitter of the transistor to the MOS capacitor and to the third metallized electrode; a wire connecting the base of the transistor to the metal sheet, thereby electrically connecting the second metallized electrode to the base via the metal sheet; a through-hole extending through the substrate and having an inside surface; and a metallized ground electrode disposed on the bottom surface of the substrate and continuously extending on the inside surface of the through-hole, the metallized ground electrode being electrically connected to the second metallized electrode under the metal sheet, the metal sheet covering and closing the through-hole at the top surface of the substrate, the through-hole being open at the bottom surface of the substrate.

According to the present invention, because a metallized electrode to which an electrode, for example, the base, of a transistor is connected is coupled through a through-hole directly to a metallized ground electrode on the bottom surface of a chip substrate, the parasitic inductance is significantly reduced so that the metallic bridge of the prior art can be eliminated. Accordingly, the degree of integration can be increased and the size of the semiconductor device can be reduced. In addition, side metallization, which has been required in conventional devices, can also be eliminated.

DESCRIPTION OF PREFERRED EMBODIMENTS

Figure 1:
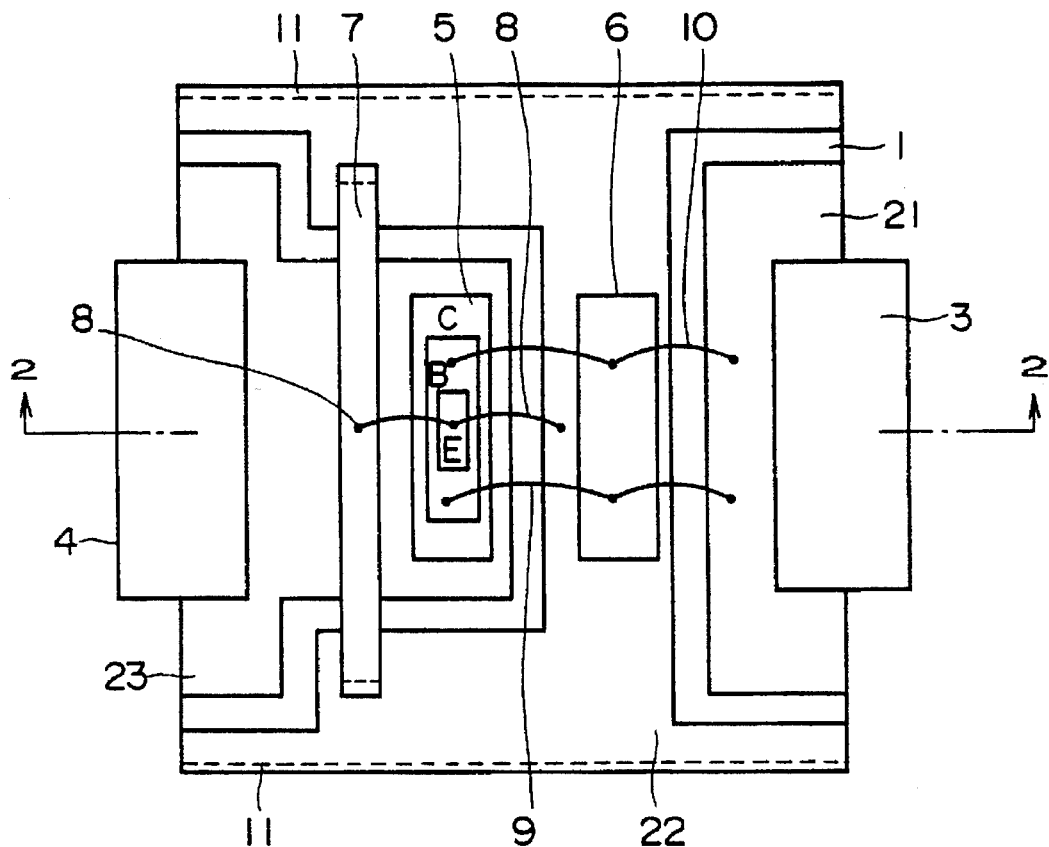
FIG. 1 is a plan view showing a conventional semiconductor device.
Figure 2:
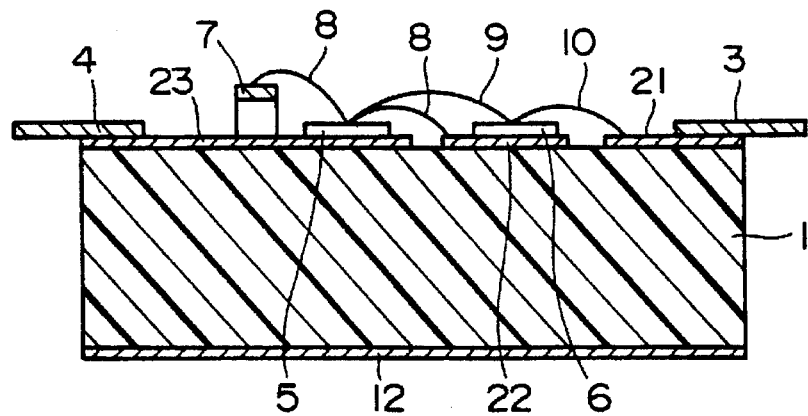
FIG. 2 is a cross-sectional view along a line 2—2 of FIG. 1.

A semiconductor device is now described in detail with reference to FIGS. 5 and 6 which are plan and cross-sectional views of the device, respectively.

Metallized electrodes 31, 32, and 33 are disposed in a predetermined pattern with given spacings between them on an insulating ceramic chip substrate 30. The chip substrate 30 is a material having good thermal conductivity, such as beryllia (BeO). Similar to the previously described conventional device, each of the metallized electrodes is a three-layer structure, such as W/Ni/Ag, W/Ni/Au, MoMn/Ni/Ag, or MoMn/Ni/Au. In a semiconductor device according to the present invention, through-holes 35 extend through the substrate 30, electrically connecting the metallized electrode 32 to a metallized ground electrode 34 disposed on the bottom surface of the substrate 30.

A base lead 36 and a collector lead 37 are respectively brazed to the metallized electrodes 31 and 33 with an Ag—Cu brazing alloy. The base lead 36 and the collector lead 37 are an Ni alloy, such as Kovar (29%Ni—17%Co—Fe) and 42 alloy (42%Ni—Fe), like those of the conventional device. A metal sheet 38 is brazed to the upper surface of the metallized electrode 32. The metal sheet 38 is an Ni alloy similar to the frame material for the base and collector leads.

Figure 3:
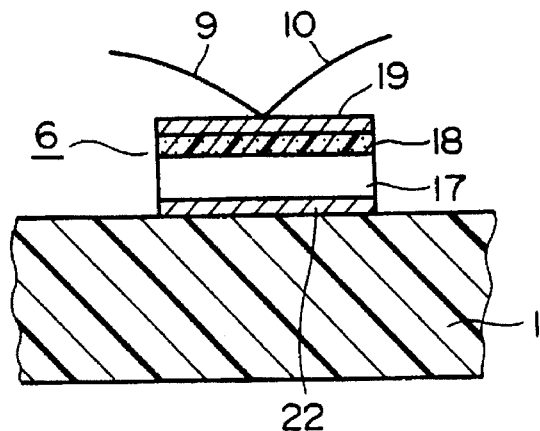
FIG. 3 is a cross-sectional view of an example of an MOS capacitor of the semiconductor device of FIG. 1.
Figure 4:
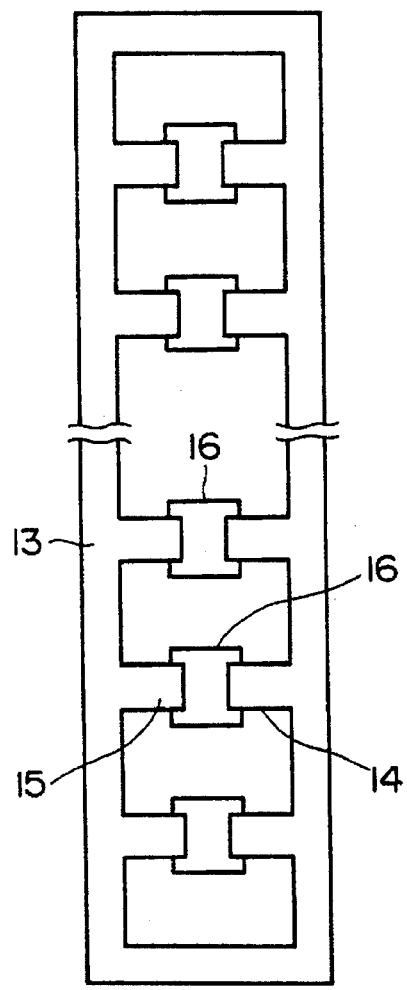
FIG. 4 shows a chip brazed to a frame in the conventional semiconductor device of FIG. 1.

A high frequency, high output transistor 39 is mounted on the metallized electrode 33 with its collector C in contact with the metallized electrode 33. An MOS capacitor 40 is mounted on the metal sheet 38 on the metallized electrode 32. The emitter E of the transistor 39 is electrically connected by a wire 41 to the metal sheet 38, and the base B is electrically connected to the MOS capacitor 40 by wires 42. The MOS capacitor 40 is electrically connected by wires 43 to the metallized electrode 31. The structure of the MOS capacitor 40 may be similar to that of the MOS capacitor shown in FIG. 3.

The above-described semiconductor device operates as a grounded-emitter circuit with the collector C of the transistor 39 being connected to the collector lead 37, the emitter E being connected by the through-holes 35 to the metallized ground electrode 34, and the base B being connected to the base lead 36. The MOS capacitor 40 connected between the base B of the transistor 39 and the metallized ground electrode 34 cancels the parasitic inductance that is introduced into the circuit by the wires 41, 42, and 43.

The upper ends of the through-holes 35 are closed by the metal sheet 38 on which the MOS capacitor 40 is mounted, as previously stated, but the lower ends are normally open so that gas which is produced during baking of the substrate 30 and brazing of the lead frame and the metal sheet can rapidly escape from the open ends of the through-holes 35.

Furthermore, with the lower ends of the through-holes 35 left open, the metallization material for metallizing the respective electrodes can enter into the through-holes 35 to reduce reactance including inductive and resistive components.

Because of the through-holes 35 in the insulating substrate 30 for connecting a metallized electrode, for example, the electrode 32, on the upper surface of the substrate directly to the metallized ground electrode 34 on the bottom surface of the substrate, an electrode of the high frequency, high output transistor 39 mounted on the substrate is grounded through a shortest path without a side metallization. Thus, the parasitic inductance is significantly smaller than that of conventional semiconductor devices, such as the one shown in FIG. 1, and, accordingly, a superior high frequency characteristic is achieved. Furthermore, according to the present invention, a metallic bridge is eliminated so that the device can be made small and integrated to a high degree.

Figure 5:
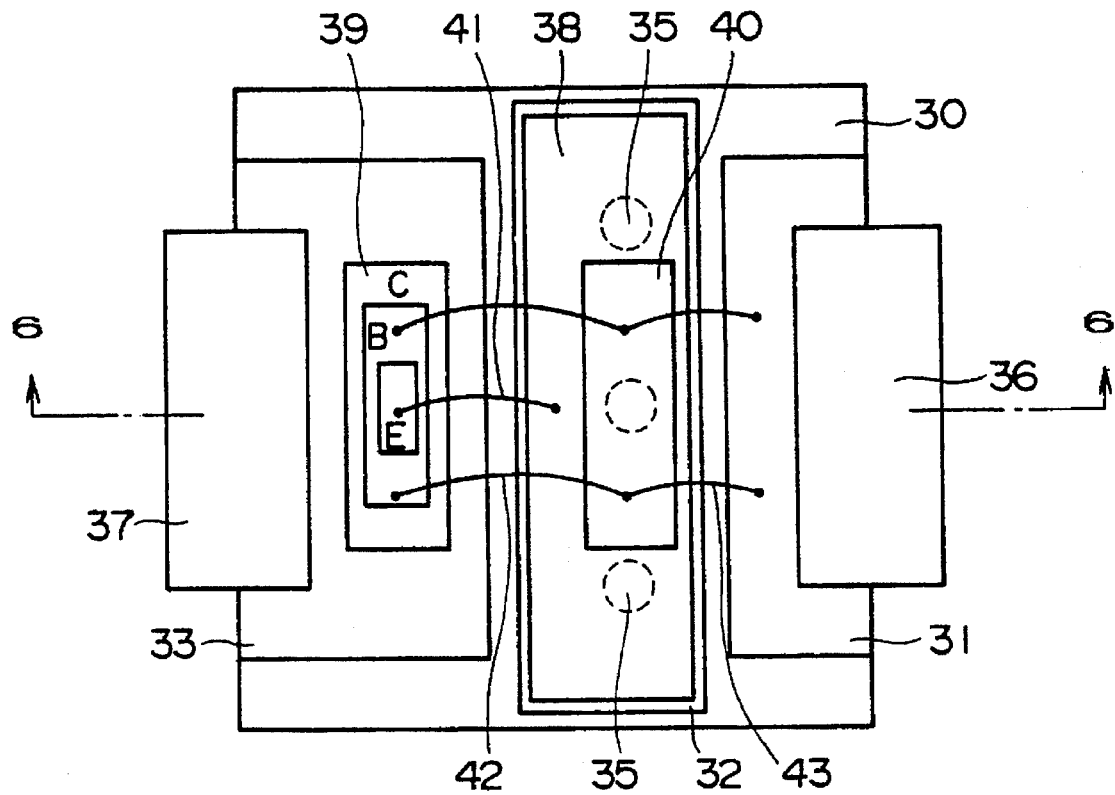
FIG. 5 is a plan view of a semiconductor device according to one embodiment of the present invention.
Figure 6:
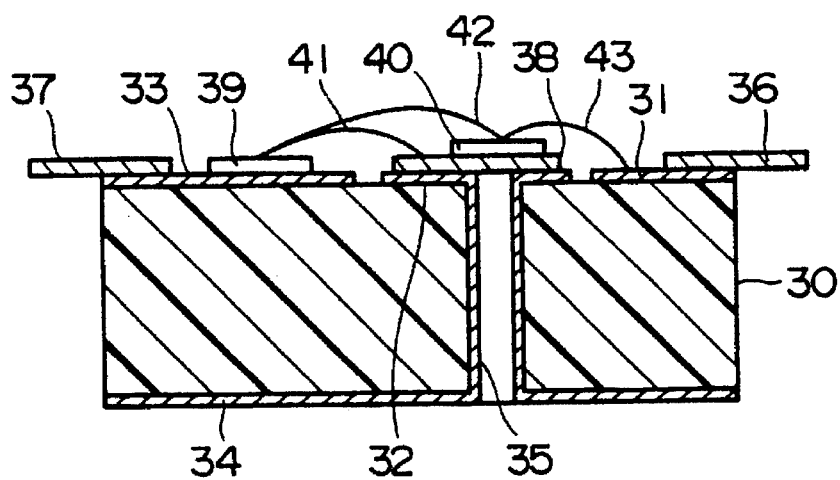
FIG. 6 is a cross-sectional view along line 6—6 of FIG. 5.
Figure 7:
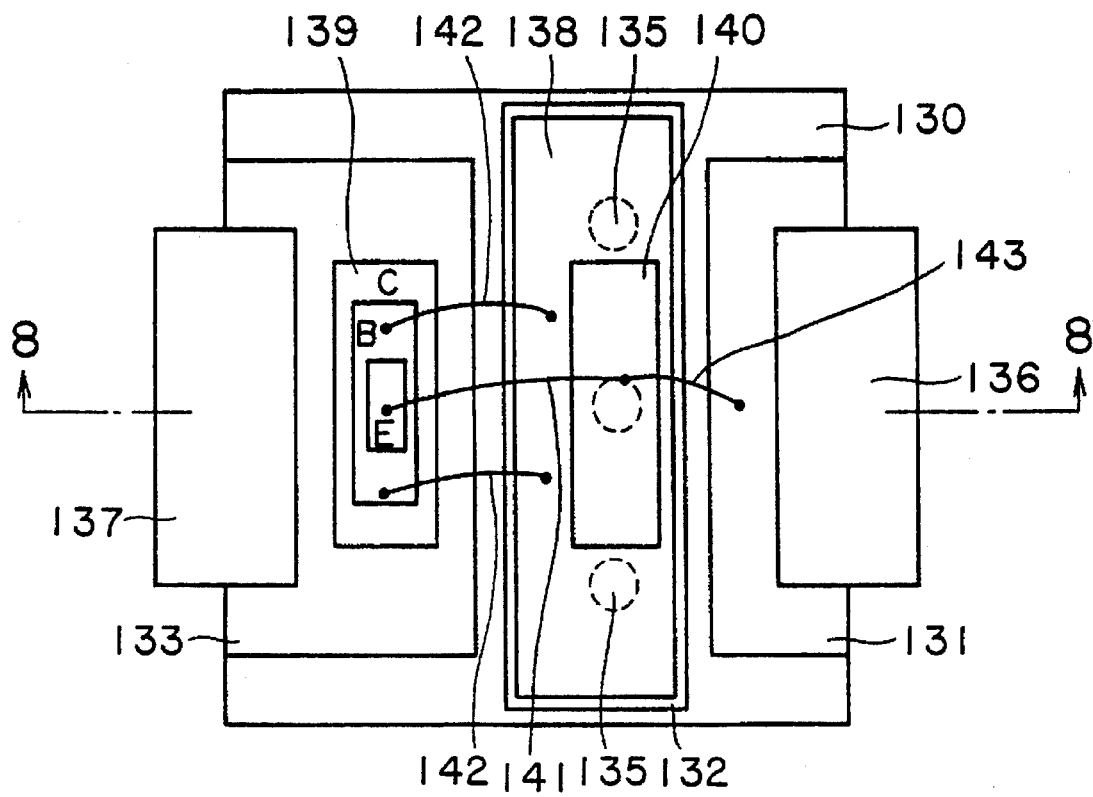
FIG. 7 is a plan view of a semiconductor device according to an embodiment of the present invention.
Figure 8:
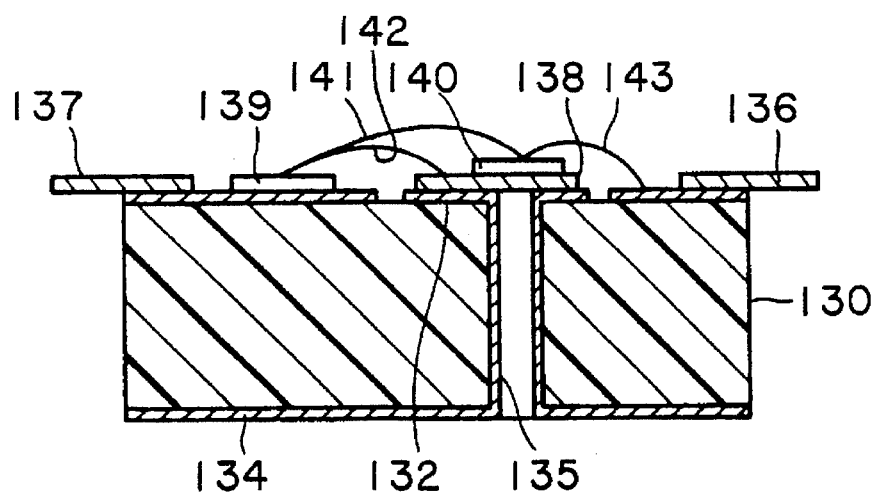
FIG. 8 is a cross-sectional view along line 8—8 of FIG. 7.

In FIGS. 5 and 6, the through-holes are beneath the metal sheet 38 to which the emitter E of the transistor 39 is to be connected, but, depending on the transistor configuration, through-holes may be beneath other metallized electrodes to which a grounded transistor electrode is connected, as shown, for example, in FIGS. 7 and 8.

In FIGS. 7 and 8, reference numeral 130 denotes a chip substrate, and reference numerals 131, 132, and 133 denote metallized electrodes disposed on the chip substrate 130. A transistor 139 is mounted with its collector electrode C connected directly to the metallized electrode 133. A metal sheet 138 is brazed or soldered to the upper surface of the metallized electrode 132 and an MOS capacitor 140 is mounted on the metal sheet 138. The base B of the transistor 139 is electrically connected by wires 142 to the metal sheet 138 and the emitter E of the transistor 139 is electrically connected by a wire 141 to the MOS capacitor 140 which, in turn, is connected by a wire 143 to the metallized electrode 131. A collector lead 137 is connected to the metallized electrode 133 and the emitter lead 136 is connected to the metallized electrode 131. A metallized ground electrode 134 is disposed on the bottom surface of the chip substrate 130. The metallized ground electrode 134 is electrically connected via the through-holes 135 to the metallized electrode 132 to which the base B is connected. If the device does not include the MOS capacitor 140 shown in FIG. 7 and 8, the emitter E of the transistor 139 is directly electrically connected by a wire to the metallized electrode 132.

We claim:

1. A semiconductor device comprising:

an electrically insulating substrate having opposed top and bottom surfaces;

first, second, and third metallized electrodes disposed on the top surface of said substrate;

a high frequency transistor having an emitter, a base, and a collector disposed on said first metallized electrode with the collector contacting said first metallized electrode;

a metal sheet disposed on said second metallized electrode;

a wire connecting said emitter of said transistor to said third metallized electrode;

a wire connecting said base of said transistor to said metal sheet, thereby connecting said base to said second metallized electrode via said metal sheet;

a through-hole extending through said substrate and having an inside surface; and a metallized ground electrode disposed on the bottom surface of said substrate and continuously extending on the inside surface of the through-hole, electrically connected to said second metallized electrode, said metal sheet covering and closing the through-hole, the through-hole being open at the bottom surface of said substrate.

* * * * *